(12) United States Patent
Ruden et al.

(10) Patent No.: US 6,326,654 B1
(45) Date of Patent: Dec. 4, 2001

(54) HYBRID ULTRAVIOLET DETECTOR

(75) Inventors: P. Paul Ruden, Eden Prairie; Subash Krishnankutty, Minneapolis, both of MN (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/252,613

(22) Filed: Feb. 5, 1999

(51) Int. Cl.[7] .................................................. H01L 27/148
(52) U.S. Cl. ........................... 257/233; 257/78; 257/81; 257/186; 257/189; 257/201
(58) Field of Search ............................... 257/81, 78, 186, 257/189, 201, 233

(56) References Cited

U.S. PATENT DOCUMENTS

| | | |
|---|---|---|
| 4,383,267 | 5/1983 | Webb . |
| 5,146,465 | 9/1992 | Khan et al. . |
| 5,192,861 | 3/1993 | Breskin et al. . |
| 5,192,987 | 3/1993 | Khan et al. . |
| 5,198,673 | 3/1993 | Rougeot et al. . |
| 5,239,188 | 8/1993 | Takeuchi et al. . |
| 5,278,435 | 1/1994 | Van Hove et al. . |
| 5,294,789 | 3/1994 | Kruger . |
| 5,311,010 | 5/1994 | Kruger . |
| 5,378,960 | 1/1995 | Tasker et al. . |
| 5,389,571 | 2/1995 | Takeuchi et al. . |
| 5,393,993 * | 2/1995 | Edmond et al. ................. 257/77 |
| 5,523,589 | 6/1996 | Edmond et al. . |
| 5,596,186 | 1/1997 | Kobayashi . |
| 5,602,418 | 2/1997 | Imai et al. . |
| 5,621,227 * | 4/1997 | Joshi ................................. 257/184 |
| 5,625,202 | 4/1997 | Chai . |
| 5,677,538 | 10/1997 | Moustakas et al. . |
| 5,679,965 | 10/1997 | Schetzina . |
| 5,686,721 | 11/1997 | Schmidt-Bocking . |
| 5,686,734 | 11/1997 | Hamakawa et al. . |
| 5,689,123 | 11/1997 | Major et al. . |
| 5,723,877 | 3/1998 | Sugawa et al. . |

* cited by examiner

*Primary Examiner*—Fetsum Abraham
(74) *Attorney, Agent, or Firm*—Gerald B. Hollins; Thomas L. Kundert

(57) ABSTRACT

A semiconductor material avalanche photodiode photodetector having ultraviolet response, solar radiation immunity and response speed in excess of that available from conventional ultraviolet photodetectors is described. The detector is an avalanche photodiode comprised of periodic table group III-Nitride semiconductor material, such as aluminum gallium nitride, serving as a photon to charge carrier transducer, and an avalanche charge carrier multiplication region comprised of different semiconductor materials such as silicon. The photodetector is capable of selective ultraviolet signal transducing while exposed to a mixture of ultraviolet and solar energy "noise" radiation. The included avalanche multiplication region is optically shielded from solar and other energy components to enable this selective capability. A multiplied ultraviolet photoresponsive electric signal is collected from output electrodes disposed adjacent the avalanche multiplication structure. Two physical arrangements of the detector are included.

20 Claims, 2 Drawing Sheets

HYBRID ULTRAVIOLET DETECTOR

RIGHTS OF THE GOVERNMENT

The invention described herein may be manufactured and used by or for the Government of the United States for all governmental purposes without the payment of any royalty.

BACKGROUND OF THE INVENTION

A number of applications of ultraviolet photodetectors require devices having both high responsivity and relatively high speed. Such applications include, for example, ultraviolet energy-based optical communication systems and missile warning systems, a list which is considered exemplary but not limiting. The periodic table group III-Nitride alloy, $Al_xGa_{1-x}N$, is a promising material for fabricating such ultraviolet photodetectors partly because of its direct bandgap, which spans the range of 3.4 electron volts for GaN to 6.1 electron volts for AlN. (Such properties are described, for example, in S. Strite and H. Morkoc, "GaN, AlN, and InN: A Review", J. Vac. Sci. Technol. B10, 1237, 1992.) Hence, in view of the direct relationship between bandgap and cut-off wavelength, as is known in the art, photodetectors based on an appropriate choice of III-Nitride alloy composition may provide ultraviolet responses in the wavelength range below a wavelength residing somewhere between 365 nanometers and 200 nanometers, i.e., provide photodetectors of cut-off wavelengths in the range of 200 nanometers to 365 nanometers. These III-Nitride alloys have been useful in the fabrication of ultraviolet light-emitting devices having output in the same spectral range.

The good rejection of long wavelength light thus provided in a III-Nitride ultraviolet detector is additionally desirable for applications exposing the detector to background sunlight "noise". Sunlight, even on the earth's surface, has a strong ultraviolet spectral component in the wavelength range greater than about 300 nanometers in addition to well known visible and infrared components. Ultraviolet photodetectors that do not respond to light of wavelength longer than about 300 nanometers may therefore be referred to as "solar blind" ultraviolet detectors. Photoconductors and phototransistors fabricated from aluminum gallium nitride ($Al_xGa_{1-x}N$) are therefore deemed good candidates for high responsivity, solar blind detectors. The signal gain of some possible detector configurations of this material, such as photoconductor and phototransistor devices, however, is achieved at the expense of device operating speed. Photoconductors in particular have shown extremely long recovery times—as is disclosed in M. Razeghi and A. Rogalski, "Semiconductor UV Detectors", J. Appl. Phys. 79, 7433, 1996 and in B. Goldenberg, J. D. Zook and R. J. Ulmer, "Fabrication and Performance of GaN Detectors", Proc. of the Topical Workshop on III–V Nitrides, Nagoya, Japan, 1995.[2,3].

In contrast with such photoconductors and phototransistors, III-Nitride photodiodes are capable of high speed operation; see, for example, J. M. Van Hove, R. Hickman, J. J. Klaassen, P. P. Chow, and P. P. Ruden, "Ultraviolet-Sensitive, Visible-Blind GaN Photodiodes Fabricated by Molecular Beam Epitaxy", Appl. Phys. Lett. 70, 2282, 1997; and S. Krishnankutty, W. Yang, T. Nohava and P. P. Ruden, "Fabrication and Characterization of GaN/AlGaN UV Band Heterojunction Photodiodes", MRS Nitride Internet Journal, Volume 3, Article 7, 1998. Unfortunately, however, photodiode responsivity, as is disclosed in these same publications, is rather low in view of there being no signal gain mechanism operating in a conventional photodiode. The present invention provides improvement in this gain aspect of a photodiode and makes the III-Nitride photodiode a viable tool for wide bandwidth, solar blind, photodetection.

SUMMARY OF THE INVENTION

The present invention provides a semiconductor ultraviolet photon detector wherein signal detection and signal amplification occur in charge conductor-coupled separate material portions of the device, a detector also affording desirable spectral selectivity and response speed characteristics.

It is an object of the present invention therefore to provide a hybrid ultraviolet detector combining the photon-charge carrier conversion capability of one semiconductor material with the charge carrier multiplication capability of a second semiconductor material.

It is another object of the invention to provide a semiconductor ultraviolet detector of improved response speed in comparison with conventional ultraviolet detectors.

It is another object of the invention to provide an ultraviolet detector having a desirable optical signal to noise ratio.

It is another object of the invention to provide an ultraviolet detector having a desirable optical signal to noise ratio afforded by way of shielding optical noise signal components from susceptible detector areas.

It is another object of the invention to provide an ultraviolet detector combining desirable properties of direct bandgap and indirect bandgap semiconductor materials in a common structure.

It is another object of the invention to provide an ultraviolet detector having desirable input optical signal spectral selectivity characteristics.

It is another object of the invention to provide an ultraviolet detector using the avalanche charge carrier multiplication phenomenon.

It is another object of the invention to provide an ultraviolet detector using nitride materials.

It is another object of the invention to provide an ultraviolet detector using periodic table group III materials.

It is another object of the invention to provide an ultraviolet detector combining the benefits of III-Nitride and silicon materials.

It is another object of the invention to provide an ultraviolet detector combining the mechanism of charge carrier diffusion with charge carrier avalanche multiplication.

It is another object of the invention to provide an ultraviolet detector combining the benefits of laterally diffusing charge carriers with vertically oriented charge carrier multiplication.

It is another object of the invention to provide an ultraviolet detector in which charge carrier recombination effects are suppressed by an included charge carrier diffusion structure.

It is another object of the invention to provide an ultraviolet detector in which efficient diffused charge carrier injection into a charge carrier multiplication region is achieved.

Additional objects and features of the invention will be understood from the following description and claims and the accompanying drawings.

These and other objects of the invention are achieved by a group III-Nitride, solar blind, ultraviolet photodetector apparatus comprising the combination of:

a laterally-elongated group III-Nitride first semiconductor material layer structure;

an optically exposed radiant energy reception surface region located at a first lateral extremity of said first semiconductor material layer structure;

an optically obscured second semiconductor material layer structure charge carrier avalanche multiplication region vertically disposed in a downstream charge carrier location at a second lateral extremity on a surface of said first semiconductor material layer structure;

first and second charge carrier collection metallic electrode members received on a layer of said avalanche multiplication region at said second lateral extremity and on a surface of said first semiconductor material layer structure respectively.

DETAILED DESCRIPTION

Figure 1:
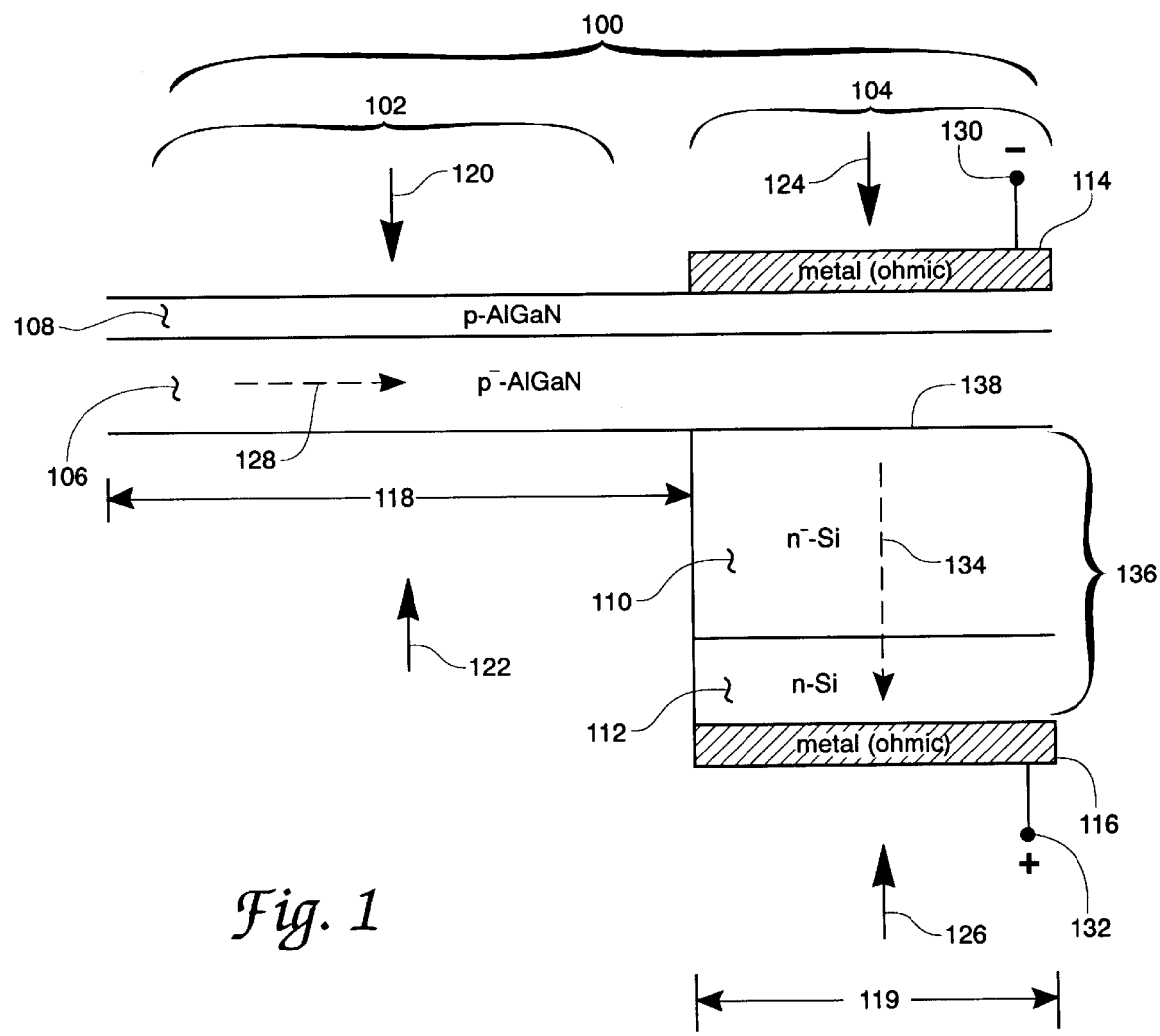
FIG. 1 shows a cross sectional representation of a gain-enhanced, solar blind top or bottom-illuminated semiconductor ultraviolet detector according to the invention.

While it may be feasible to fabricate a conventional avalanche photodiode using solely GaN or even $Al_xGa_{1-x}N$ materials, recently published calculations of the impact ionization parameters for electrons and holes in GaN indicate the electric fields required to achieve charge carrier multiplication in such a device to be undesirably high; see I. H. Oguzman, E. Bellotti, K. F. Brennan, J. Kolnik, R. Wang and P. P. Ruden, "Theory of Hole Initiated Impact Ionization in Bulk Zincblende and Wurtzite GaN", J. Appl. Phys. 81, 7827, 1997 (herein Oguzman et al.). Gain in an avalanche device is achieved through photogenerated charge carrier impact ionization and a resultant multiplication of total charge carriers available. Assuming reasonable doping parameters, it is straightforward to estimate, on the basis of the results in Oguzman et al., that such a solely III-Nitride avalanche photodiode will operate successfully only at voltages greater than 100V—an undesirably high voltage for modern day semiconductor devices and systems. Furthermore, the Oguzman et al. calculations predict the impact ionization coefficients of electrons and holes will be similar in such a device. Electron and hole impact ionization coefficient similarity has undesirable negative implications for the noise performance expected of a GaN avalanche photodiode. This is, for example, described in R. J. McIntyre, "The Distribution of Gains in Uniformly Multiplying APDs: Theory", IEEE Trans. Electron Dev. ED-19, 703, 1972; and in J. Kolnik, I. H. Oguzman, K. F. Brennan, R. Wang and P. P. Ruden, "Theoretical Prediction of Zincblende GaN Avalanche Photodiode Performance Based on Numerically Calculated Electron and Hole Impact Ionization Ratio", Mat. Res. Soc. Symp. Proc. 423, 45, 1996. It also is believed difficult to obtain the low defect density required to achieve homogeneous charge carrier multiplication over the entire active area of such a conventional avalanche photodiode device. The avalanche photodiode is nevertheless a proven device concept for achieving a photodetector having gain and high speed. The needed improvement lies in arranging such a device such that each of these difficulties is avoided or minimized to a practical degree.

In contrast with these avalanche GaN or $Al_xGa_{1-x}N$ devices, avalanche photodiodes employing silicon semiconductor material suggest desirable properties. This is partly because the impact ionization coefficients of electrons and holes in silicon are quite different (favoring electron initiated impact ionization) and moreover these coefficients are reasonably large compared to those of GaN at moderate applied electric fields; see T. Kaneda, "Silicon and Germanium APDs", appearing in "Semiconductors and Semimetals", Vol 22D, W. T. Tsang, ed., Academic Press, Orlando, 247, 1985. Hence, silicon APDs can operate with voltage drops on the order of 10V over the multiplication region, and they are relatively quiet. For present ultraviolet detector purposes however, the long cutoff wavelength of silicon photodetectors (~1 micrometer) precludes their use as solar blind ultraviolet detectors, unless rather complex filters are inserted into the optical system. These filters lower the quantum efficiency of the system significantly and add substantially to its cost and complexity.

Efficient generation of photocarriers in the absorption region of an avalanche photodiode device is also a requirement for achieving desirable photodetector performance. Even in the near infrared spectral region, silicon with its indirect bandgap is not an optimal choice from this perspective; in the ultraviolet region silicon is even less desirable. A hybrid structure with separate absorption and multiplication regions each composed of the most suitable of these materials for its purpose is however a promising candidate for a selective ultraviolet avalanche photodetector device. Such a device, as additionally disclosed herein, combines the favorable impact ionization properties of silicon with the high absorption region quantum efficiency of a direct band gap material.

A recently demonstrated device of a similar hybrid type is the group III–V materials (indium gallium-arsenide/silicon) so-called SHIP detector based on an $In_xGa_{1-x}As$ absorption layer and a silicon multiplication region, see for example A. R. Hawkins, W. Wu, P. Abraham, K. Streubel and J. E. Bowers, "High Gain-Bandwidth Product Silicon Heterointerface Photodetector", Appl. Phys. Lett. 70, 303, 1997. In this device, the $In_xGa_{1-x}As$ material has a bandgap smaller than that of silicon, thus giving the detector a cutoff characteristic for wavelengths greater than about 1300 nanometers. Unless the device is exposed to incident light of short wavelength, carrier generation in the avalanche region does not occur. Hence, for detection near the $In_xGa_{1-x}As$ multiplication cutoff wavelength, the silicon part of the ultraviolet device is simply transparent. In view of this relatively long cutoff wavelength the $In_xGa_{1-x}As$ SHIP detector is of course unsuited for the present solar blind ultraviolet detector use. The device of the present invention, however, utilizes the hybrid concept with different materials capable of providing the desired solar blind and ultraviolet response characteristics.

Figure 2:
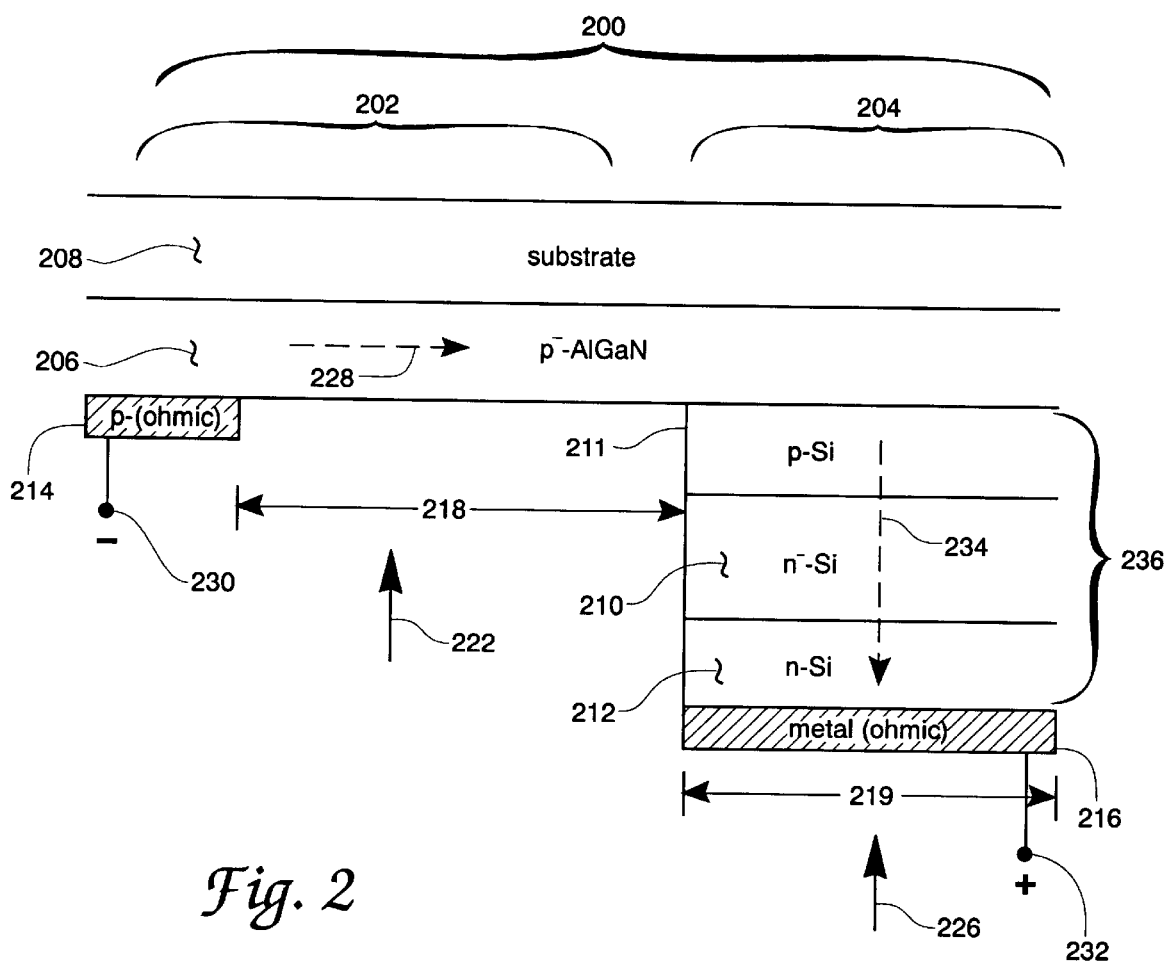
FIG. 2 shows a cross sectional representation of a reach-through hybrid, gain-enhanced, solar blind bottom-illuminated semiconductor ultraviolet detector according to the invention.

FIG. 1 and FIG. 2 in the drawings therefore show two silicon/III-Nitride (Si/III-N) hybrid semiconductor devices operable as solar blind ultraviolet avalanche photodiode detectors. Both the FIG. 1 and FIG. 2 devices combine the interband photon absorption characteristics of III-N material with the carrier enhancement properties of a silicon charge carrier multiplication region.

In the FIG. 1 drawing of a photodiode device 100 there is shown a layer of lightly p⁻-doped AlGaN semiconductor material 106 on which is disposed a more heavily p-doped layer of AlGaN material 108. For present photodiode usage, the FIG. 1 layers 106 and 108 may have combined thickness dimensions larger than the absorption length. The semiconductor material layers 106 and 108 in FIG. 1 are generally divided into two different regions—an input optical energy reception region 102 and a gain enhancement and electrode region 104. Underlying the p⁻layer 106 at one extremity of the FIG. 1 photodiode, in the gain enhancement and electrode region 104, is a multiple layered structure of differing semiconductor material, the signal avalanche structure 136, which is comprised of a layer of lightly n⁻-doped silicon semiconductor material 110 overlaid by a layer of n-doped or undoped silicon semiconductor material 112. The silicon semiconductor material layers 110 and 112 may have thickness dimensions in the range of microns in a typical embodiment of the FIG. 1 device.

Disposed on the p-AlGaN material layer 108 in the gain enhancement and electrode region 104 is a metallic electrode 114 which is also connected with one output signal terminal, a negative terminal 130. A similar electrode and positive terminal 116 and 132 are used also in the gain enhancement and electrode region 104 at the lower extremity of the silicon layers. The FIG. 1 electrodes 114 and 116 are of an ohmic relationship with the underlying semiconductor material layers.

Functionally the FIG. 1 avalanche photodiode structure consists of p/p⁻type III-Nitride absorption layers, layers 106 and 108 in the region 102 and a silicon multiplication region, the layers 110 and 112, in the region 104. Device operation includes photogeneration of electron-hole pairs in the III-Nitride material of region 102 in response to incident ultraviolet photons 120 or 122 of wavelength shorter than the cut-off wavelength. Subsequently, the photoelectrons diffuse in the p⁻layer 106 along the path 128 towards the III-Nitride/Si junction 138 where they are swept into the avalanche region of the silicon layers 110 and 112 and multiply by impact ionization along the path 134. Secondary electrons and holes cause further impact ionization along path 134 providing the usual large multiplication gain factor. The generated primary and secondary holes are collected by the contact 114 with the p-layer.

The region 104 portion of the FIG. 1 device is shielded from both solar energy and ultraviolet energy arriving along the paths 124 or 126 by the reflecting metal of the contact layers 114 and 116. This shielding is especially desirable with respect to solar energy arriving along these paths since the silicon of the avalanche structure 136 would otherwise be highly responsive to the solar energy wavelengths. Since this shielding, in addition to eliminating solar input "noise", also limits the photosensitive area of the device, applications requiring two-dimensional arrays of avalanche photodiodes will be most practical when the ratio of the lateral dimensions 118 and 119 of the absorption layer and the multiplication layer can be made relatively large. (For single detectors or one-dimensional [linear] arrays, the shielded regions need not limit the total active area.)

Lateral diffusion of photoelectrons in the absorption layers 106 is aided by the p/p⁻layer structure which suppresses recombination through spatial separation of electrons in layer 106 from the large hole density in the p-region of layer 108. Significant to operation of the FIG. 1 device is the achievement of a sufficiently long diffusion length characteristic in the absorption layers 106 and 108 so that the lateral distance 118 can be made large.

FIG. 2 in the drawings shows an alternative avalanche photodiode arrangement also using lateral transport of photocarriers in a III-Nitride absorption layer to a vertically disposed silicon layer multiplication region. In the FIG. 2 drawing there is shown a layer of p⁻-doped AlGaN semiconductor material 206 that is supported on a substrate 208. For the FIG. 2 photodiode the layer 206 may have a thickness large compared to the absorption lengths. The semiconductor material layer 206 is again generally divided into two different regions, an input photon reception region 202 and a gain enhancement region 204. Underlying the p⁻layer 206 at one extremity of the FIG. 2 photodiode, in the gain enhancement region 204, is a multiple layered structure of differing semiconductor material, i.e., the avalanche structure 236, which is comprised of a layer of p-doped silicon semiconductor material 211 overlaid by a layer of highly n⁻-doped silicon semiconductor material 210 and in turn overlaid by layer of n-doped silicon semiconductor material 212. The silicon semiconductor material layers 211, 210 and 212 may have total thickness dimensions in the range of microns in a typical embodiment of the invention.

Disposed on the p AlGaN material layer 206 in photon reception region 202 is a metallic electrode member 214 which is also connected with one output signal terminal, a negative terminal 230. A second electrode and positive terminal 216 and 232 are located in the gain enhancement and electrode region 204 at the lower extremity of the silicon layers. The FIG. 2 electrodes 214 and 216 are of an ohmic relationship with the underlying semiconductor material layers.

The mode of operation of the FIG. 2 photodiode is essentially that of a reach-through avalanche photodiode, i.e., a photodiode wherein equilibrium carriers are fully extracted. By applying a sufficiently large positive voltage to the n-Si electrode 216, the p-Si and the p⁻-III-Nitride absorption layer 206 will be fully depleted and a lateral field will force photoelectrons created in the absorption layer 206 along the path 228 into the gain-providing region of the avalanche structure 236 for multiplication along the orthogonal path 234 and collection at the negative electrode 216. The hole carriers are collected at the electrode 214 and the terminal 230. The separate absorption and multiplication regions in two dimensional form in the FIG. 2 device provide added distinction over an avalanche photodiode of one dimensional nature.

In both the FIG. 1 and FIG. 2 types of photodiode devices, the thickness of the total absorption layers 106 and 206 should be sufficiently large to ensure adequate quantum efficiency. This may be somewhat easier to achieve with the FIG. 2 reach-through arrangement because it does not rely on vertical electron-hole separation to achieve long lifetimes. The typical silicon avalanche layer 110 and 210 thickness is similar to that of conventional silicon avalanche photodiodes, i.e., a thickness comparable to the impact ionization length. The FIG. 2 photodiode device provides an ultraviolet energy input aperture in the region of path 222 and reflection of energy received in the region of path 226. As is the case in FIG. 1, it is desirable for the ratio of distances 218 and 219 in FIG. 2 to be as large as possible in the device in order to obtain a large fill factor in a two dimensional array arrangement.

Several recent developments in III-Nitride film growth and in device fabrication techniques appear to be of relevance with respect to physical embodiments of the FIG. 1 and FIG. 2 photodiode devices. For example, epitaxial growth of III-Nitride materials by molecular beam epitaxy on silicon substrates has recently yielded functional short wavelength light-emitting diodes. This work is reported in S. Guha and N. A. Bojarczuk, "UV and Violet GaN Light-Emitting Diodes on Si", Appl. Phys. Lett. 72, 415, 1998 and work of this nature is also described in several of the U.S. patents identified in connection with the present document, including the U.S. Pat. No. 5,602,418 of H. Imai et al., which is hereby incorporated by reference herein.

Although the active material of the Guha et al. devices is grown on an AlN buffer layer, this thin layer apparently does not impede the transport of electrons from n-Si into the III-Nitride material as is also reported in the Guha publication. Hence, epitaxial growth of the FIG. 1 structure is believed feasible. The challenge attending such growth is believed to reside in the subsequent processing required to remove the silicon partially in the areas defined by dimensions 118 and 218 and under contact 214 in the FIG. 1 and FIG. 2 devices, i.e., in input aperture areas in the path of the input ultraviolet light. Use of a SIMOX (i.e., Separation by IMplanted OXygen) wafer, in which a thin buried oxide provides an etch stop layer, is viewed as one approach to this step.

The growth of silicon on III-Nitride material layers (as opposed to the reverse growth procedure which has been used by others in the case of a silicon substrate) is considered to be another area of processing interest with respect to the FIG. 2 arrangement of the present invention. With such growth the FIG. 2 photodiode embodiment becomes relatively easy to realize, inasmuch as it does not require substrate removal, but merely selective removal of the thin silicon layer in region 218 and under contact 214 in FIG. 2. We believe there have been few if any attempts to grow silicon on III-Nitride. One reason for this appears to reside in little need for such material. Actually, a realization of the FIG. 1 structure may be approached from either the direction of growth of AlGaN material on a silicon initial layer or from growth of a silicon layer on an initial AlGaN layer. The first of these approaches has been used in the realization of light-emitting and light sensing devices on a silicon substrate in the prior art; however, questions of lattice interface may yet remain. Similarly with the second of these approaches, growth of a silicon layer on an initial AlGaN layer, the AlGaN layer provides the initial crystal structure and there may also arise questions of crystal interface quality achieved in an overlaying silicon layer. Notably in the present invention the AlGaN to silicon interface is required to support a flow of charge carriers in contrast with many prior art devices, involving a silicon to AlGaN interface, where the silicon is often a substrate element and determinative of lattice structure but is itself less involved in charge carrier flow.

Another promising recent result of interest with respect to a physical realization of the present invention is the successful fabrication of hybrid $In_xGa_{1-x}As$/Si avalanche photodiodes by a wafer fusion technique; this effort is reported in the above identified article of A. R. Hawkins, W. Wu, P. Abraham, K. Streubel and J. E. Bowers, "High Gain-Bandwidth Product Silicon Heterointerface Photodetector", Appl. Phys. Lett. 70, 303, 1997. These results have demonstrated that the fused $Si/In_xGa_{1-x}As$ interface is of sufficiently high quality that it does not appear to have a negative impact on the electrical device characteristics. $In_xGa_{1-x}As$/Si photodiodes are also disclosed in the U.S. patents identified in connection with the filing of the present document.

III-Nitride fusion to silicon has also been achieved by this same Hawkins et al. group. In general, the fusion process seems to be facilitated by a presence of indium, hence a very thin interfacial layer of InN may be desirable in the structures described herein. Such an interface layer is believed to be free of a deleterious effect on photodiode performance, so long as photogeneration of electron hole pairs by long wavelength light "noise" remains negligible. Substrate removal for fabrication of the structure shown in FIG. 1 may then be possible using the technique disclosed by W. S. Wong, T. Sands and N. W. Cheung, in "Damage-Free Separation of GaN Thin Films from Sapphire Substrates", Appl. Phys. Lett. 72, 599, 1998. This Wong et al. article and each of the other reference publications identified herein is hereby incorporated by reference into this document.

The exclusion of possible incident long wavelength photon flux from the silicon part of the disclosed solar blind hybrid III-Nitride/Si, ultraviolet avalanche photodiode device is a significant consideration in the present invention—since photons from such exposure give rise to undesirable detector response. If efficiency reducing filters are to be avoided, the photodiode of the present invention therefore needs to have optically isolated absorption and avalanche regions shown in FIG. 1 and FIG. 2 herein. A conventional avalanche photodiode arrangement having absorption and avalanche regions vertically integrated along the optical axis is therefore not suitable for present purposes. However, alternative physical arrangements from those shown in FIG. 1 and FIG. 2 may also accommodate this requirement and are considered within the scope of the invention.

The disclosed hybrid III-Nitride/Si, ultraviolet avalanche photodiode device therefore combines the favorable short wavelength interband absorption properties of direct bandgap III-Nitride material with the desirable impact ionization carrier multiplication characteristics of silicon. Solar blind response is achieved through optical isolation of the otherwise solar active multiplication region of the device. The invention is additionally characterized by optically isolated photon absorption and charge carrier multiplication regions plus lateral transport of photocarriers and vertical avalanche photocarrier multiplication.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. Periodic table group III-Nitride solar blind ultraviolet photodetector apparatus comprising the combination of:

a laterally-elongated group III-Nitride first semiconductor material layer structure;

an optically exposed photon reception surface region comprising said laterally-elongated group III-Nitride first semiconductor material layer structure and commencing at a first lateral extremity of said first semiconductor material layer structure;

an optically obscured second semiconductor material layer structure charge carrier avalanche multiplication region vertically disposed in a downstream charge carrier location at a second lateral extremity of said first semiconductor material layer structure and on a surface of said first semiconductor material layer structure;

first and second charge carrier collection metallic electrode members disposed on a layer of said avalanche multiplication region at said second lateral extremity and on a surface of said first semiconductor material layer structure respectively.

2. The group III-Nitride solar blind ultraviolet photodetector apparatus of claim 1 wherein said laterally-elongated first semiconductor material layer structure is comprised of first and second aluminum gallium nitride semiconductor material layers.

3. The group III-Nitride solar blind ultraviolet photodetector apparatus of claim 2 wherein said charge carrier avalanche multiplication region is disposed on an exposed surface of said first Aluminum Gallium Nitride semiconductor material layer and said second charge carrier collection metallic electrode member is disposed on an exposed surface of said second Aluminum Gallium Nitride semiconductor material layer.

4. The group III-Nitride solar blind ultraviolet photodetector apparatus of claim 2 wherein said first and second charge carrier collection metallic electrode members are ohmic contact members disposed in vertical alignment shielding of said charge carrier avalanche multiplication region from incident light.

5. The group III-Nitride solar blind ultraviolet photodetector apparatus of claim 2 wherein said charge carrier avalanche multiplication region is comprised of first and second layers of silicon semiconductor material.

6. The group III-Nitride solar blind ultraviolet photodetector apparatus of claim 5 wherein said laterally-elongated first and second Aluminum Gallium Nitride semiconductor material layers are comprised of p- and p doped Aluminum Gallium Nitride semiconductor materials respectively and said charge carrier avalanche multiplication region first and second layers of silicon semiconductor material are comprised of n and n- doped silicon semiconductor materials.

7. The group III-Nitride solar blind ultraviolet photodetector apparatus of claim 1 wherein said laterally-elongated first semiconductor material layer structure is comprised of a layer of Aluminum Gallium Nitride semiconductor material disposed on an overlaying layer of electrically insulating substrate material.

8. The group III-Nitride solar blind ultraviolet photodetector apparatus of claim 7 wherein said charge carrier avalanche multiplication region is disposed on a lateral extremity exposed surface of said Aluminum Gallium Nitride semiconductor material layer and said second charge carrier collection metallic electrode member is disposed on an opposed lateral extremity exposed surface of said second Aluminum Gallium Nitride semiconductor material layer.

9. The group III-Nitride solar blind ultraviolet photodetector apparatus of claim 7 wherein said layer of electrically insulating substrate material is comprised of sapphire material.

10. The group III-Nitride solar blind ultraviolet photodetector apparatus of claim 7 wherein said charge carrier avalanche multiplication region is comprised of first, second and third layers of silicon semiconductor material, semiconductor material inclusive of p, n⁻ and n-dopings respectively.

11. Substrate-removed ultraviolet spectrum-responsive solar blind hybrid avalanche multiplier photodiode semiconductor apparatus comprising the combination of:
 a first laterally-elongated group III-Nitride first semiconductor material layer;
 a second laterally-elongated group III-Nitride second semiconductor material layer overlying said first semiconductor material layer and of greater dopant concentration than said first semiconductor material;
 said first and second semiconductor material layers forming an input photon reception surface region of said photodiode semiconductor apparatus;
 an input photon-obscured second semiconductor material multiple layer structure charge carrier avalanche multiplication region vertically disposed on an exposed lower surface of said first laterally-elongated group III-Nitride first semiconductor material layer in a downstream charge carrier location of said photodiode semiconductor apparatus;
 first and second charge carrier collection ohmic metallic electrode members disposed on an exposed lower layer of said avalanche multiplication region and on an exposed upper surface of said second semiconductor material layer structure respectively.

12. The substrate-removed ultraviolet spectrum-responsive solar blind avalanche multiplier photodiode semiconductor apparatus of claim 11 wherein:
 said III-Nitride first semiconductor material is p⁻-aluminum gallium nitride; and
 said III-Nitride second semiconductor material is p-aluminum gallium nitride.

13. The substrate-removed ultraviolet spectrum-responsive solar blind avalanche multiplier photodiode semiconductor apparatus of claim 11 wherein said second semiconductor material multiple layer structure charge carrier avalanche multiplication region is comprised of:
 a layer of n⁻-silicon disposed on said first laterally-elongated group III-Nitride first semiconductor material layer at one lateral extremity thereof;
 a layer of n-silicon disposed on said layer of n⁻-silicon;
 said first charge carrier collection ohmic metallic electrode member disposed on an exposed lower layer of said layer of n-silicon.

14. The substrate-removed ultraviolet spectrum-responsive solar blind avalanche multiplier photodiode semiconductor apparatus of claim 11 wherein said first and second semiconductor material layers forming an input photon reception surface region of said photodiode semiconductor apparatus are each transparent to photon energy and comprise a bi-directional input port of said photodiode semiconductor apparatus.

15. The substrate-removed ultraviolet spectrum-responsive solar blind avalanche multiplier photodiode semiconductor apparatus of claim 11 further comprising orthogonally disposed charge carrier flow paths laterally disposed in said first laterally-elongated group III-Nitride first semiconductor material layer and in said second semiconductor material multiple layer structure charge carrier avalanche multiplication region.

16. Ultraviolet spectrum-responsive solar blind hybrid reach through avalanche multiplier photodiode semiconductor apparatus comprising the combination of:
 a laterally-elongated group III-Nitride first semiconductor material layer disposed on an overlying electrical insulating substrate member;
 said first semiconductor material layer comprising an input photon reception surface region of said photodiode semiconductor apparatus;
 an input photon-obscured second semiconductor material multiple layer structure charge carrier avalanche multiplication region vertically disposed on an exposed lower surface of said first semiconductor material layer input photon reception surface region of said photodiode semiconductor apparatus in a downstream charge carrier lateral extremity of said photodiode semiconductor apparatus;
 first and second charge carrier collection ohmic metallic electrode members disposed on an exposed lower layer of said avalanche multiplication region and on a laterally opposed exposed lower surface of said laterally-elongated group III-Nitride first semiconductor material layer respectively.

17. The ultraviolet spectrum-responsive solar blind reach through avalanche multiplier photodiode semiconductor apparatus of claim 16 wherein said group III-Nitride first semiconductor material is p-Aluminum Gallium Nitride material.

18. The ultraviolet spectrum-responsive solar blind reach through avalanche multiplier photodiode semiconductor apparatus of claim 16 wherein said charge carrier avalanche multiplication region is covered by said first charge carrier collection ohmic metallic electrode member and is input photon-obscured and solar blind in response to said first ohmic metallic electrode member.

19. The ultraviolet spectrum-responsive solar blind reach through avalanche multiplier photodiode semiconductor apparatus of claim 16 wherein said charge carrier avalanche multiplication region is comprised of:

a p-silicon first semiconductor layer disposed on said group III-Nitride first semiconductor material layer;

an $n^-$-silicon semiconductor second layer disposed over said p-silicon first semiconductor layer;

an n-silicon third semiconductor layer disposed over said $n^-$-silicon second semiconductor layer;

said charge carrier collection first ohmic metallic electrode member disposed over said n-silicon third semiconductor layer.

20. The group III-Nitride solar blind ultraviolet photodetector apparatus of claim 1 wherein said first and second charge carrier collection metallic electrode members are disposed at one of said first and second lateral extremities.

* * * * *